(12) United States Patent
Tashiro et al.

(10) Patent No.: US 11,891,685 B2
(45) Date of Patent: Feb. 6, 2024

(54) VACUUM PROCESSING APPARATUS

(71) Applicant: ULVAC, INC., Kanagawa (JP)

(72) Inventors: Yukihito Tashiro, Kanagawa (JP); Shigeru Sugiyama, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 333 days.

(21) Appl. No.: 17/433,140

(22) PCT Filed: Mar. 11, 2020

(86) PCT No.: PCT/JP2020/010586
§ 371 (c)(1),
(2) Date: Aug. 23, 2021

(87) PCT Pub. No.: WO2021/014675
PCT Pub. Date: Jan. 28, 2021

(65) Prior Publication Data
US 2022/0154324 A1 May 19, 2022

(30) Foreign Application Priority Data
Jul. 22, 2019 (JP) .................................. 2019-134821

(51) Int. Cl.
*H01J 37/34* (2006.01)
*C23C 14/34* (2006.01)
(Continued)

(52) U.S. Cl.
CPC ........ *C23C 14/34* (2013.01); *H01J 37/32513* (2013.01); *H01J 37/32733* (2013.01); *H01J 37/3435* (2013.01); *H01L 21/67167* (2013.01)

(58) Field of Classification Search
None
See application file for complete search history.

(56) References Cited

U.S. PATENT DOCUMENTS

| 6,035,804 A | 3/2000 | Arami et al. |
| 2003/0131794 A1* | 7/2003 | Rosenstein ............ C23C 16/44 |
| | | 156/345.1 |

(Continued)

FOREIGN PATENT DOCUMENTS

| CN | 2830419 Y | 10/2006 |
| JP | 10-41096 A | 2/1998 |
| JP | 2011-253842 A | 12/2011 |

OTHER PUBLICATIONS

International Search Report for PCT Patent App. No. PCT/JP2020/010586 (dated May 26, 2020).

*Primary Examiner* — Jason Berman
(74) *Attorney, Agent, or Firm* — Cermak Nakajima & McGowan LLP; Tomoko Nakajima

(57) ABSTRACT

The vacuum processing apparatus for performing predetermined vacuum processing on a processing surface of a to-be-processed substrate is made up of: a vacuum chamber having disposed therein a to-be-processed substrate and having formed, on an upper wall of the vacuum chamber, a mounting opening facing the processing surface where a direction in which the processing surface looks is defined as an upper side; a processing unit for performing therein vacuum processing; and a communication pipe having a predetermined length and being interposed between the vacuum chamber and the processing unit such that predetermined processing is performed, through the communication pipe, on the to-be-processed substrate inside the vacuum chamber. The processing unit has an engaging means to which is coupled a swing arm for swinging about a rotary shaft extending perpendicularly to a vertical direction for selectively engaging the vacuum chamber and the communication pipe or the processing unit and the communication pipe.

4 Claims, 5 Drawing Sheets

(51) Int. Cl.
*H01J 37/32* (2006.01)
*H01L 21/67* (2006.01)

(56) References Cited

U.S. PATENT DOCUMENTS

2004/0251130 A1* 12/2004 Liu ................... H01J 37/3441
204/298.01
2006/0071384 A1   4/2006 Lee et al.

* cited by examiner

VACUUM PROCESSING APPARATUS

TECHNICAL FIELD

This application is a national phase entry under 35 U.S.C. § 371 of PCT Patent Application No. PCT/JP2020/010586, filed on Mar. 11, 2020, which claims priority under 35 U.S.C. § 119 to Japanese Patent Application No. 2019-134821, filed Jul. 22, 2019, both of which are incorporated by reference.

The present invention relates to a vacuum processing apparatus for performing predetermined vacuum processing on a processing surface of a substrate to be processed (i.e., a to-be-processed substrate). In more detail, the vacuum processing apparatus has a vacuum chamber which has disposed therein the to-be-processed substrate and has formed, on an upper wall of the vacuum chamber, a mounting opening facing the processing surface where a direction in which the processing surface looks is defined as an upper side; a processing unit for performing vacuum processing; and a communication pipe of a predetermined length, which is interposed between the vacuum chamber and the processing unit. The vacuum processing apparatus so arranged as to perform a predetermined vacuum processing through the communication pipe is constructed to attain a better maintenance performance.

BACKGROUND ART

In the steps of manufacturing, e.g., a semiconductor device, in order to consistently perform various kinds of vacuum processing, on the to-be-processed substrate in the vacuum atmosphere, such as heat treatment, ion bombardment processing, film-forming processing, etching processing and the like, there is widely used a vacuum processing system of a so-called cluster tool type which is provided with a central transportation chamber in which is disposed a transportation robot, and a plurality of processing chambers arranged to enclose the transportation chamber are widely utilized (see, e.g., patent document 1). As the film forming processing to be performed in any one of the processing chambers, there is one using the sputtering method (sputtering apparatus). Among them, there is a method in which the distance (TS distance) between a target which is a constituting element of a processing unit (cathode unit) to perform vacuum processing, and a processing surface of the to-be-processed substrate disposed inside the vacuum chamber is set comparatively longer. It is thus so arranged that the sputtered particles discharged out of the sputtering surface at the time of sputtering of the target are made to be incident on the processing surface substantially vertically (so-called LTS method).

In case an existent cathode unit is utilized so as to constitute a sputtering apparatus capable of film forming by the LTS method, it is normal practice to dispose between a vacuum chamber and the cathode unit a communication pipe whose length is appropriately set corresponding to the TS distance, wherein the vacuum chamber has disposed therein a to-be-processed substrate, and provided that the direction in which the surface to be processed looks is defined as an upper side, and a mounting opening of the vacuum chamber has formed on an upper wall a mounting opening facing the to-be-processed surface. Inside the vacuum chamber and the communication pipe, normally a deposition preventing plate is disposed.

It is to be noted here that the target is a so-called consumable and that the deposition preventing plate on which the sputtered particles have been adhered may become a source for generation of fine particles. Therefore, the vacuum chamber is opened to the atmosphere to thereby periodically exchange the target and the deposition preventing plate. The timing of replacing the target and the timing of replacing the deposition preventing plate do not necessarily coincide with each other. In addition, cleaning to remove the particles adhered to the wall surface of the vacuum chamber and to the parts present inside thereof (e.g., gas pipes to introduce the sputtering gas) becomes periodically necessary. Normally, such cleaning will often be done at the same time as the replacement of the deposition preventing plate.

By the way, the cathode unit and the communication pipe are ordinarily heavy items. Therefore, in case the replacement of the deposition preventing plate and cleaning inside the vacuum chamber must be performed without accompanying the replacement of the target, the cathode unit must be opened by means of an opening and closing mechanism having rotatable arms, thereby performing the work from above the communication pipe, resulting in poor workability. In addition, should the worker remove the cathode unit out of position by using, e.g., a hoist crane installed in the existing facilities, to remove the cathode unit and further, by using the hoist crane installed in the existing facilities to thereby remove the communication pipe and thereafter perform the above-mentioned cleaning work, there will be a problem in that the maintenance performance is remarkably poor.

PRIOR ART DOCUMENTS

Patent Documents

Patent Document 1: JP-2010-162611A

SUMMARY OF THE INVENTION

Problems that the Invention is to Solve

In view of the above-mentioned points, this invention has a problem of providing a vacuum processing apparatus which has a construction of good maintenance performance even in case a communication pipe exists between the vacuum chamber and the processing unit.

Means for Solving the Problems

In order to solve the above-mentioned problem, this invention is a vacuum processing apparatus for performing predetermined vacuum processing on a processing surface of a to-be-processed substrate. The vacuum processing apparatus comprises: a vacuum chamber having disposed therein the to-be-processed substrate and, provided that a direction in which the to-be-processed surface looks is defined as an upper side, having formed on an upper wall of the vacuum chamber a mounting opening facing the processing surface where a direction in which the processing surface looks is defined as an upper side; a processing unit for performing therein vacuum processing; a communication pipe having a predetermined length and being interposed between the vacuum chamber and the processing unit such that predetermined processing is performed, through the communication pipe, on the to-be-processed substrate inside the vacuum chamber in vacuum atmosphere. In the vacuum processing apparatus the processing unit further comprises an engaging means to which is coupled a swing arm to swing about a rotary shaft extending perpendicularly to a vertical direction for selectively engaging the vacuum chamber and the communication pipe or the processing unit and the communication pipe.

According to this invention, in case the vacuum chamber is opened to the atmosphere in order to subject it to maintenance job (e.g., in case of replacement of the target when the processing unit is a cathode unit for the sputtering apparatus), the vacuum chamber and the communication pipe are selectively engaged with each other manually or automatically. At this time, the processing unit and the communication pipe remain disengaged from each other. When the worker swings the swing arm manually or automatically by a motor about a rotary shaft, the processing unit will accordingly be disengaged from the communication pipe. When the swing arm is swung about by the predetermined rotational angle (e.g., about 180 degrees), the processing unit will be turned upside down. As a result, the worker can perform the maintenance job by making a direct access to the processing unit at a position away from the vacuum chamber by a distance depending on the length of the swing arm.

On the other hand, in case the vacuum chamber is opened to the atmosphere in order to subject the inside of the vacuum chamber to maintenance job (e.g., in case of replacing the deposition preventing plates or cleaning the inside of the vacuum chamber), the cathode unit and the communication pipe are selectively brought into engagement with each other either manually or automatically by the engaging means. Suppose, at this time, that the engagement between the vacuum chamber and the communication pipe is in a state of having been released. Then, when the worker swings the swing arm about the rotary shaft manually or automatically by means of the motor, accompanied by this operation, the communication pipe, together with the processing unit, will be released from the vacuum chamber. Accompanied by the above operations, the processing unit and the communication pipe are released from the vacuum chamber. When they are swung by a predetermined swing angle (e.g., 180 degrees), the processing unit and the communication pipe can be withdrawn (or evacuated) into a position separated away from the vacuum chamber by a distance depending on the length of the swing arm. According to this arrangement, the worker can perform maintenance job by making a direct access from the mounting opening of the vacuum chamber.

In this manner, according to this invention, by arranging to selectively engage by the engaging means the vacuum chamber and the communication pipe or the processing unit and the communication pipe so that what is released from the vacuum chamber varies with the swinging of the swing arm. Therefore, even in case the communication pipe is present between the vacuum chamber and the processing unit, the construction will have good maintenance performance. Here, in case the construction of this invention is applied to a cluster tool, an arrangement may be made such that the swing arm is swung in a direction away from the center of the transport chamber. Then, there will be no disadvantage in those such facilities disposed in other processing chambers as are provided in the circumference of the transport chamber, e.g., other processing chambers, piping for coolant, and the like will be an impediment so as to impede the workability.

In this invention, the engaging means preferably comprises: fastening blocks respectively disposed vertically in a projecting manner on outer surfaces of the processing unit so as to face one another in the vertical direction; and fastening members for fastening each of the fastening blocks that lie opposite to one another. According to this arrangement, by fastening through the manual job each of the fastening blocks that face one another by means of fastening members such as bolts and the like, recognition can advantageously be made of the portion which is subjected to maintenance job. By the way, it is enough if the fastening members are provided so that each of the fastening blocks can be fastened from, e.g., either one direction of the upper and lower sides.

In addition, in this invention, the vacuum processing apparatus shall preferably further comprise: projections, hemispherical in shape disposed in one of the vacuum chamber and the communication pipe at a position on a front side in swinging direction, where the direction in which the processing unit is swung by the swing arm toward the vacuum chamber is defined as the front side in swinging direction; and such accepting recesses for receiving the projections as are formed in the other of the vacuum chamber and the communication pipe. According to this arrangement, after having finished the maintenance job on the vacuum chamber, when the worker swings the swing arm either manually or automatically by the motor at the time of mounting the communication pipe once again to the vacuum chamber, first, the projections are inserted into the accepting recesses and the communication pipe is being positioned relative to the vacuum chamber (i.e., the mounting opening) so that the projections are fitted into the accepting recesses. The communication pipe is thus mounted once again on the vacuum chamber in the right posture. In this case, preferably the accepting recesses and the projections shall preferably be provided in at least two pieces on the same imaginary circle at a predetermined distance from each other. In addition, in order to facilitate the smooth insertion of the projections into the accepting recesses, preferably the hemispherical projections at a position on a front side in the swinging direction shall be formed with guide slopes.

MODES FOR CARRYING OUT THE INVENTION

With reference to the drawings, a description will now be made of an embodiment based on an example in which a vacuum processing system of a so-called cluster tool type inclusive of a sputtering apparatus as a part of the system, on condition that: the processing unit for performing vacuum processing is a cathode unit for sputtering; the vacuum processing apparatus is a sputtering apparatus equipped with this cathode unit; and a to-be-processed substrate is a silicon wafer (hereinafter called "substrate Sw"). In the following description, unless particularly referred to, the terms such as "upper" and "lower" shall be based on the posture of the processing chamber in the course of processing as shown in FIG. 2.

Figure 1:
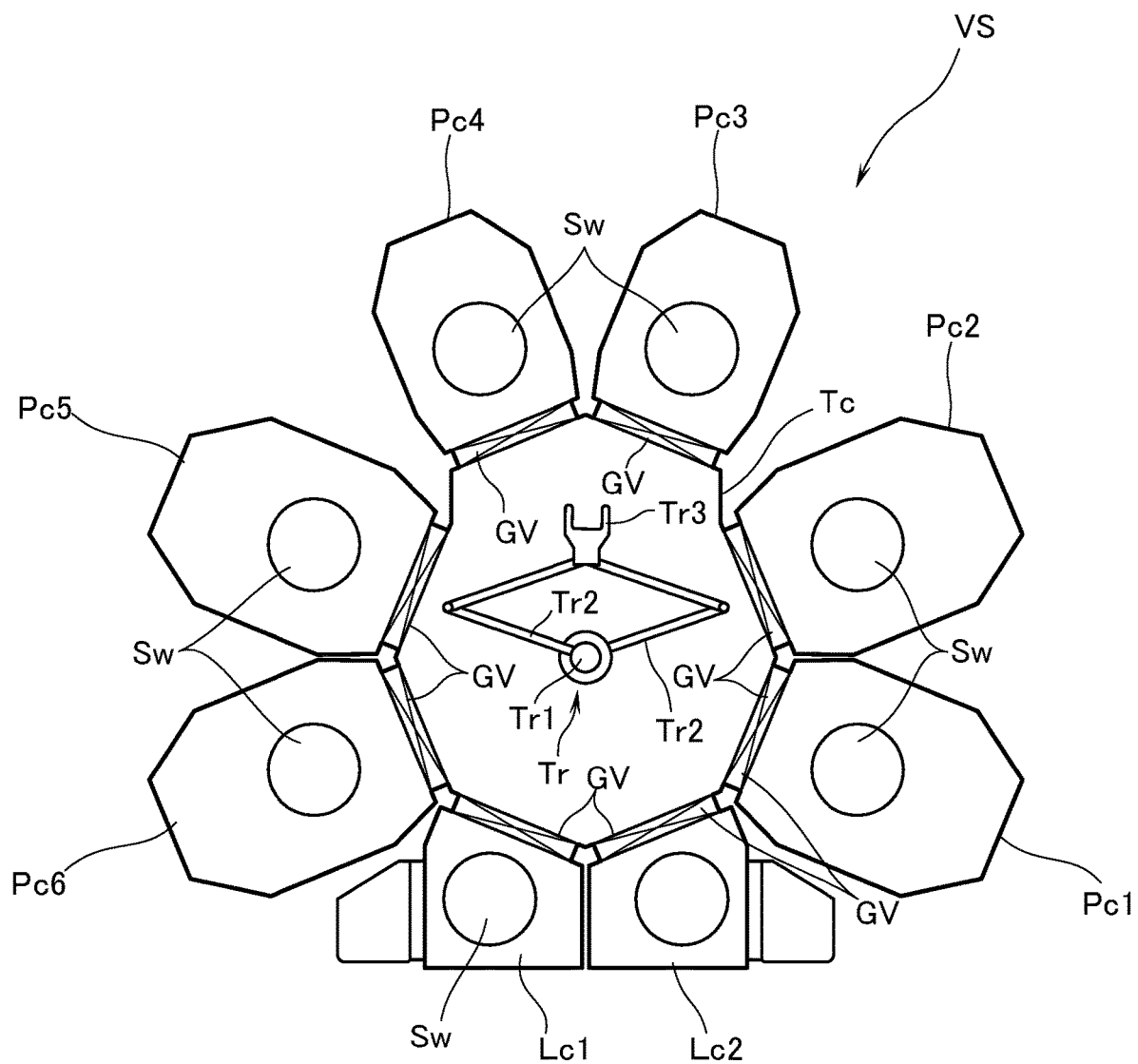
FIG. 1 is a schematic diagram to show an arrangement of a vacuum processing system which has a vacuum processing apparatus as a part thereof.

The vacuum processing system VS in FIG. 1 is provided with a transport chamber Tc in its center, having a substantially octagonal profile. The transport chamber Tc has mounted therein a transport robot Tr which transports the substrate Sw in the vacuum atmosphere. The transport robot Tr is provided with: two rotary shafts Tr1 which are disposed coaxially with each other and are rotatable and movable up and down; a pair of robot arms Tr2 which are of frog-leg type of horizontally telescopic and which are connected to an upper end of each of the rotary shafts Tr1; and a robot hand Tr3 for supporting a substrate Sw mounted on a front end of respective robot arms Tr2. Around the transport chamber Tc there are disposed two bilaterally symmetrical load lock chambers Lc1, Lc2; and six processing chambers Pc1-Pc6 side by side with one another by interposing a gate valve Gv therebetween. In each of the processing chambers Pc1-Pc6 there will be performed various kinds of vacuum processing such as heat treatment, film-deposition processing, etching processing, and the like. Although not explained by particularly illustrating, each of the transport chambers Tc, each of the load lock chambers Lc1, Lc2 and each of the processing chambers Pc1-Pc6 have respectively connected thereto vacuum pumps which are made up of turbo-molecular pumps, rotary pumps, and the like. It is thus so arranged that the inside thereof can be independently evacuated down to a predetermined pressure. In the following, a description will be made based on an example in which the processing chamber Pc3 is constituted by a sputtering apparatus SM provided with a cathode unit CU according to this embodiment. As to the vacuum processing performed in each of the other processing chambers Pc1, Pc2, Pc4-Pc6, there can be utilized the known ones, therefore further description will be omitted.

Figure 2:
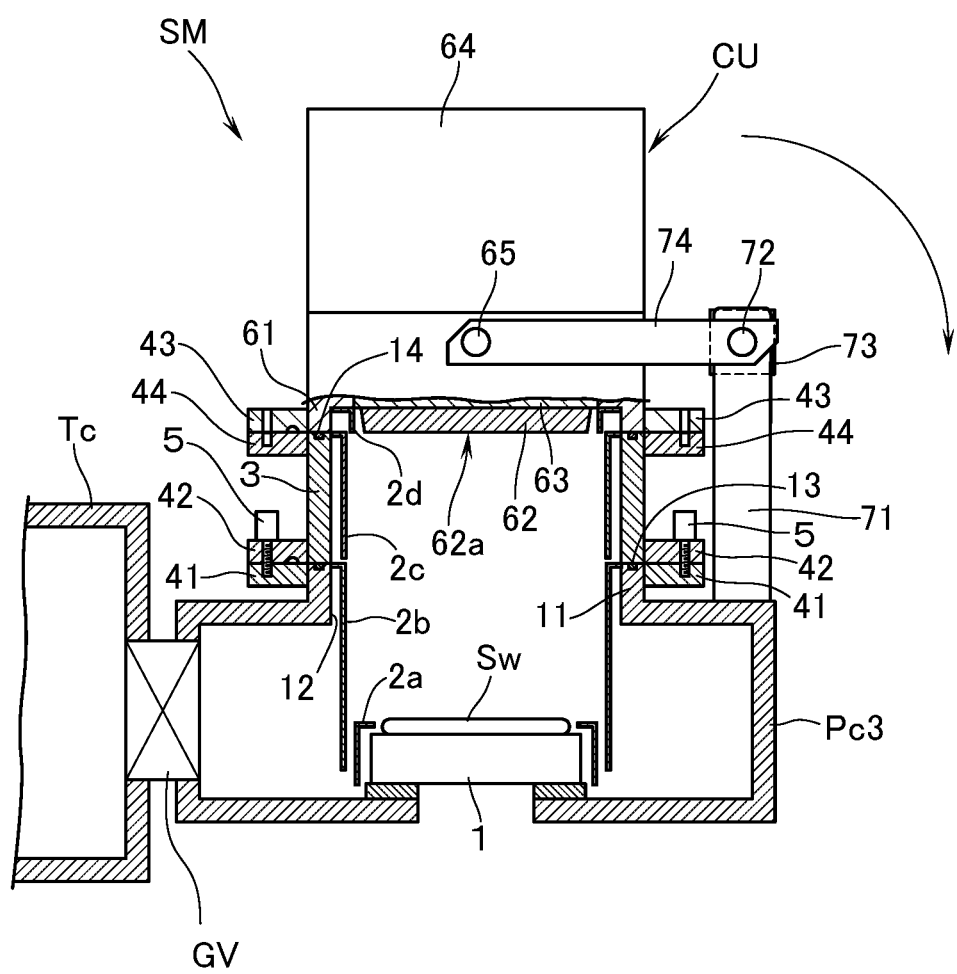
FIG. 2 is a vertical sectional view showing the above-mentioned vacuum processing apparatus (sputtering apparatus).
Figure 3:
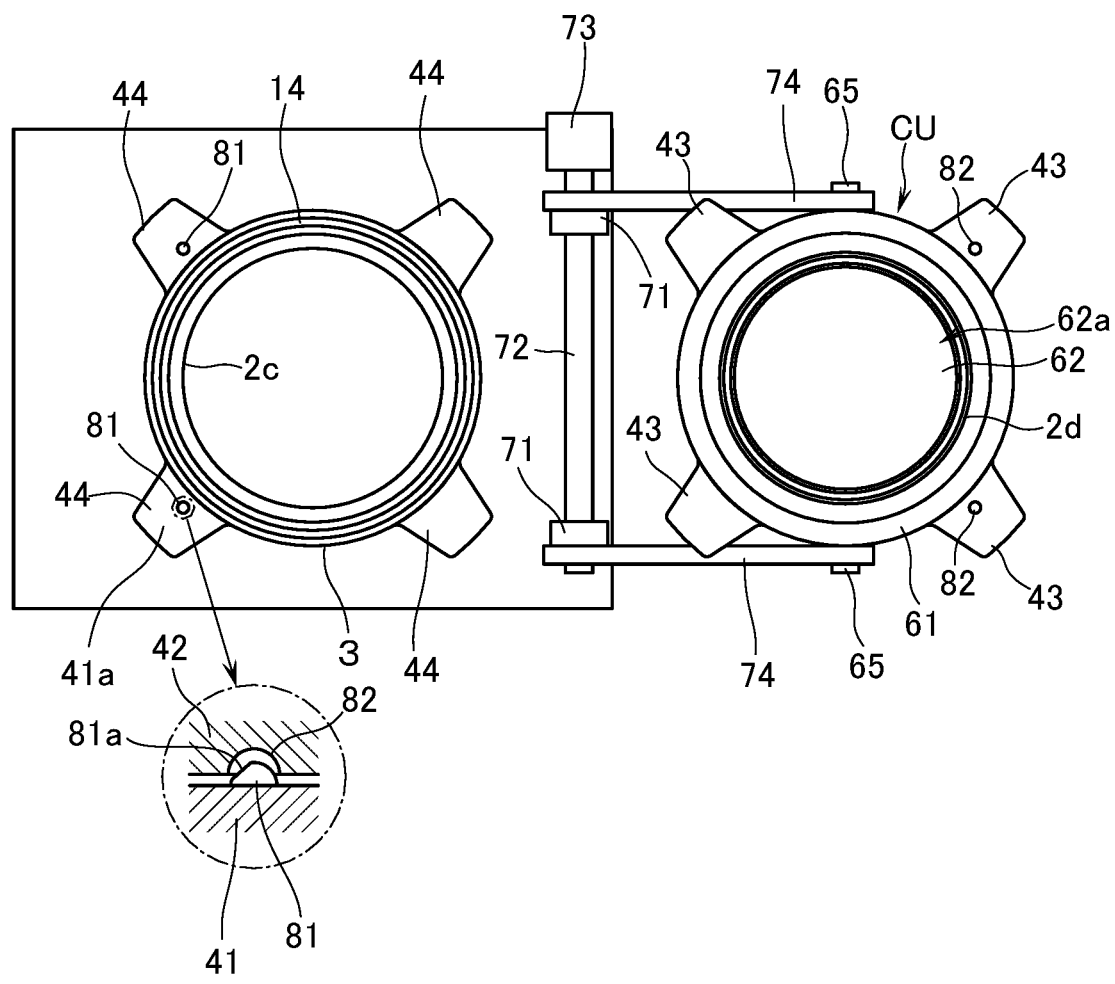
FIG. 3 is a plan view of the above-mentioned vacuum processing apparatus which is shown in a state in which the communication pipe and the cathode unit have been withdrawn.

With reference to FIGS. 2 and 3, inside the lower part of the processing chamber Pc3 which is the constituting element of the sputtering apparatus SM there is provided a stage 1 on which is placed in position the substrate Sw in a posture in which the to-be-processed surface is provided on the upper side. Although not explained by particularly illustrating, the stage 1 is made up of a metallic base having, e.g., a tubular contour, and a chuck plate which is adhered to an upper surface of the base, and it is so arranged that, during film formation by sputtering, the substrate Sw can be held in position by suction. In this case, an arrangement may be made that the base contains therein a passage for circulating the cooling medium or a heater so that, during film formation, the substrate Sw can be controlled to a predetermined temperature. The processing chamber Pc3 is provided inside thereof with annular deposition preventing plates 2a, 2b in a detachable manner. It is thus so arranged that the deposition of sputtered particles to the portions other than the substrate Sw, such as to the inner wall surface of the processing chamber Pc3, to the outer surface of the stage 1, and the like, can be restrained to the best extent possible. In a manner to oppose the substrate Sw disposed on the stage 1, on the upper wall of the processing chamber Pc3 there is detachably mounted the cathode unit CU through the communication pipe 3.

The upper wall of the processing chamber Pc3 has opened a mounting opening 12 defined by a projection 11 which projects upward, and on an upper surface of the projection 11 there is provided an annular groove (not illustrated) and an O-ring 13 as a vacuum sealing is disposed into the recessed groove. Then, the lower surface of the communication pipe 3 is coupled through the O-ring 13 to the upper surface of the projection 11 so that the communication pipe 3 can be mounted on the processing chamber Pc3. The communication pipe 3 is constituted by a metallic tubular body such as stainless steel, aluminum, and the like. The length of the communication pipe 3 is appropriately set depending on the distance (so-called TS distance) between the substrate Sw and the target which is described later, and the plate thickness thereof is appropriately set so as not to be deformed by the atmospheric pressure that is operated at the time of exhausting into vacuum of the processing chamber Pc3. The communication pipe 3 is detachably provided inside thereof with cylindrical deposition preventing plates so that the deposition of the sputtered particles to the inner wall surface can be restrained to the extent possible. The peripheral surface of the upper end of the projection 11 and the peripheral surface of the lower end of the communication pipe 3 are respectively provided in a projecting manner with four pieces of fastening blocks 41, 42 having a predetermined plate thickness at a circumferential interval of 90 degrees. Each of the fastening blocks 41, 42 has respectively formed thread holes (not illustrated) that penetrate vertically through. It is thus so arranged that, when the lower surface of the communication pipe 3 is joined to the upper surface of the projection 11, each of the fastening blocks 41, 42 can be fastened by means of bolts 5 with each of the opposing fastening blocks 41, 42 as the fastening members. By the way, the bolts 5 may be so arranged that the fastening blocks 41, 42 can be fastened from, e.g., either one side of the upper side and the lower side.

The cathode unit CU is provided with a bottomed cylindrical supporting body 61, and a target 62 which has joined a copper backing plate 63 to a surface opposing the to-be-sputtered surface 62a (upper surface). It is thus so arranged that, in a state in which the supporting body 61 and the backing plate 63 are hermetically sealed, the target that is integral with the backing plate 63 can be detachably mounted on the supporting body 61. The target 62 shall be appropriately selected depending on the composition of the thin film to be formed on the substrate Sw. In addition, in a predetermined position of the supporting body 61, there is provided an annular deposition preventing plate 2d so as to function as an anode at the time of sputtering. By the way, in FIG. 2, reference mark 64 denotes a cathode cover which stores therein known parts such as: a magnet unit which causes a closed magnetic field or a cusped magnetic field to function on the space on such a side of the communication pipe 3 as is on the front side of the sputtering surface 62a; wires from the sputtering power supply (not illustrated) disposed outside the processing chamber Pc; gas pipes to introduce the sputtering gas inclusive of the rare gas and the reactive gas into the above-mentioned space; and the like. Since the cathode unit CU itself can be used from the known ones, further description will be omitted inclusive of the film-forming method using the cathode unit CU.

On the upper surface of the communication pipe 3 there is provided an annular U-shaped groove (not illustrated), and the U-shaped groove is provided with an O-ring 14 as the vacuum sealing. Then, the lower surface of the supporting body 61 of the cathode unit CU is joined to the upper surface of the communication pipe 3 through the O-ring 14, thereby mounting the cathode unit CU on the communication pipe 3. According to this arrangement, in an assembled state as shown in FIG. 2, the space in which the target 62 faces the substrate Sw inside the processing chamber 3 is isolated. After having evacuated the inside thereof down to a predetermined pressure, the film formation on the substrate Sw becomes possible through the communication pipe 3 by sputtering the target 62. Further, the lower-end outer peripheral surface of the supporting body 61 and the upper-end outer peripheral surface of the communication pipe 3 are, in a similar manner as above, provided in a projecting manner with tightening blocks 43, 44 of a predetermined plate thickness at a predetermined circumferential distance (distance of 90 degrees in this embodiment) while coinciding the vertical phase with each other. Each of the tightening blocks 43, 44 has formed therein, similarly as above, threaded holes (not illustrated) which penetrate in the vertical direction. It is thus so arranged that, when the lower surface of the supporting body 61 is joined to the upper surface of the communication pipe 3, each of the opposing blocks 43, 44 can be tightened by bolts 5. In this embodiment, each of the blocks 41-44 and the bolt 5 constitute engaging means.

In the upper wall portion of the processing chamber Pc3 which is positioned from the transport chamber Tc toward the diametrically outward of the processing chamber Pc3 is vertically provided with two supporting columns 71, 71. Between the supporting columns 71, 71 there is rotatably supported a rotary shaft 72 which extends perpendicularly to the vertical direction. In such a portion of the rotary shaft 72 as projects outward from one of the supporting columns 71, there is coupled a motor 73. The rotary shaft 72 has, further, coupled thereto two swing arms 74, 74 at a space from each other in the longitudinal direction of the rotary shaft. It is thus so arranged that the swing arms 74, 74 can be swung about the rotary shaft 72. In this case, the circumferential surface of the supporting body 61 is provided with a supporting shaft 65 in a projecting manner at a phase shift of 180 degrees. This supporting shaft 65 has mounted thereon a front end part of the swing arms 74, 74. It is thus so arranged that the supporting body 61 can be tilted within a range of predetermined small angles. The height position (from the upper wall of the processing chamber Pc3) of the rotary shaft 72 and the shape of the swing arms 74, 74 have no particular limits but can appropriately be set considering the length of the communication pipe 3, the maintenance performance of the worker. Hereinbelow description will now be made, with reference to FIGS. 4 and 5, of the procedure of maintenance such as of routine replacement of target 62 and deposition preventing plates 2a-2d by opening the processing chamber Pc3 to atmosphere, and cleaning of wall surfaces and the like inside the processing chamber Pc3, and the like.

Figure 4:
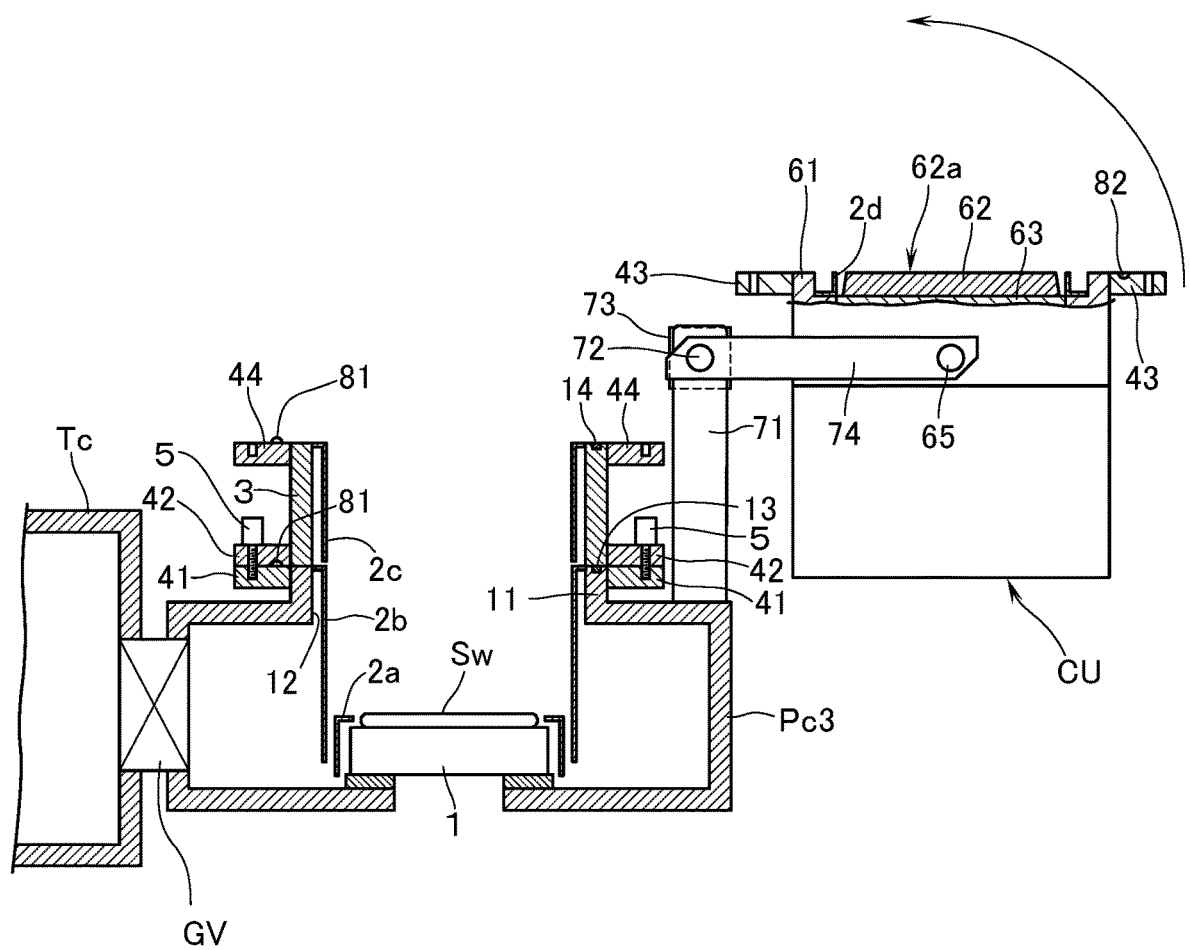
FIG. 4 is a vertical sectional view, corresponding to FIG. 1, in a state in which only the cathode unit has been withdrawn.

After having opened to atmosphere the processing chamber Pc3 from the state shown in FIG. 2, in case, e.g., the target 62 is replaced by the manual work of the worker, each of the fastening blocks 41, 42 lying opposite to each other is fastened together with bolts 5 and the communication pipe 3 is selectively engaged with the processing chamber Pc3. At this time, each of the fastening blocks 43, 44 lying opposite to each other shall be left in a state free from fastening with bolts 5. Then, the rotary shaft 72 is rotated by the motor 73 in the normal direction of rotation (in the arrow direction in FIG. 2), thereby swinging each of the swing arms 74, 74 in a manner to be away from the transport chamber Tc. Accompanied by this operation, the cathode unit CU gets separated from the communication pipe 3. Once the swing arms 74, 74 get swung to the position in which the rotary shaft 72 has rotated 180 degrees, as shown in FIG. 4, the cathode unit CU will be turned upside down at a position in which the cathode unit CU is away from the transport chamber Tc in the radially outward direction. According to this arrangement, the worker can perform the maintenance job such as the replacement of the target 62, replacement of the deposition preventing plate 2d, by making a direct access to the cathode unit CU from above, at a position away from the processing chamber Pc3 by a distance depending on the length of the swing arms 74, 74. At this time, there will be no disadvantage in that the workability is impaired by the hindrance due to the other processing chambers Pc2, Pc4 that are adjacent to the processing chamber Pc3, or due to the facilities such as the piping for the coolant, and the like.

Upon completion of the maintenance job, the worker will rotate the rotary shaft 72 by the motor 73 from the state shown in FIG. 4 to the reverse direction (in the direction of arrow in FIG. 4) so as to swing each of the swing arms 74, 74 in the reverse direction. According to this operation, the lower surface of the supporting body 61 will be joined again to the upper surface of the communication pipe 3 through the O-ring 14. Although not explained by particularly illustrating, it is preferable to dispose a detection means such as a microswitch and the like at a position where the supporting body 61 and the communication pipe 3 are joined together, so as to detect whether the supporting body 61 has been joined to the communication pipe 3 in a correct posture.

Figure 5:
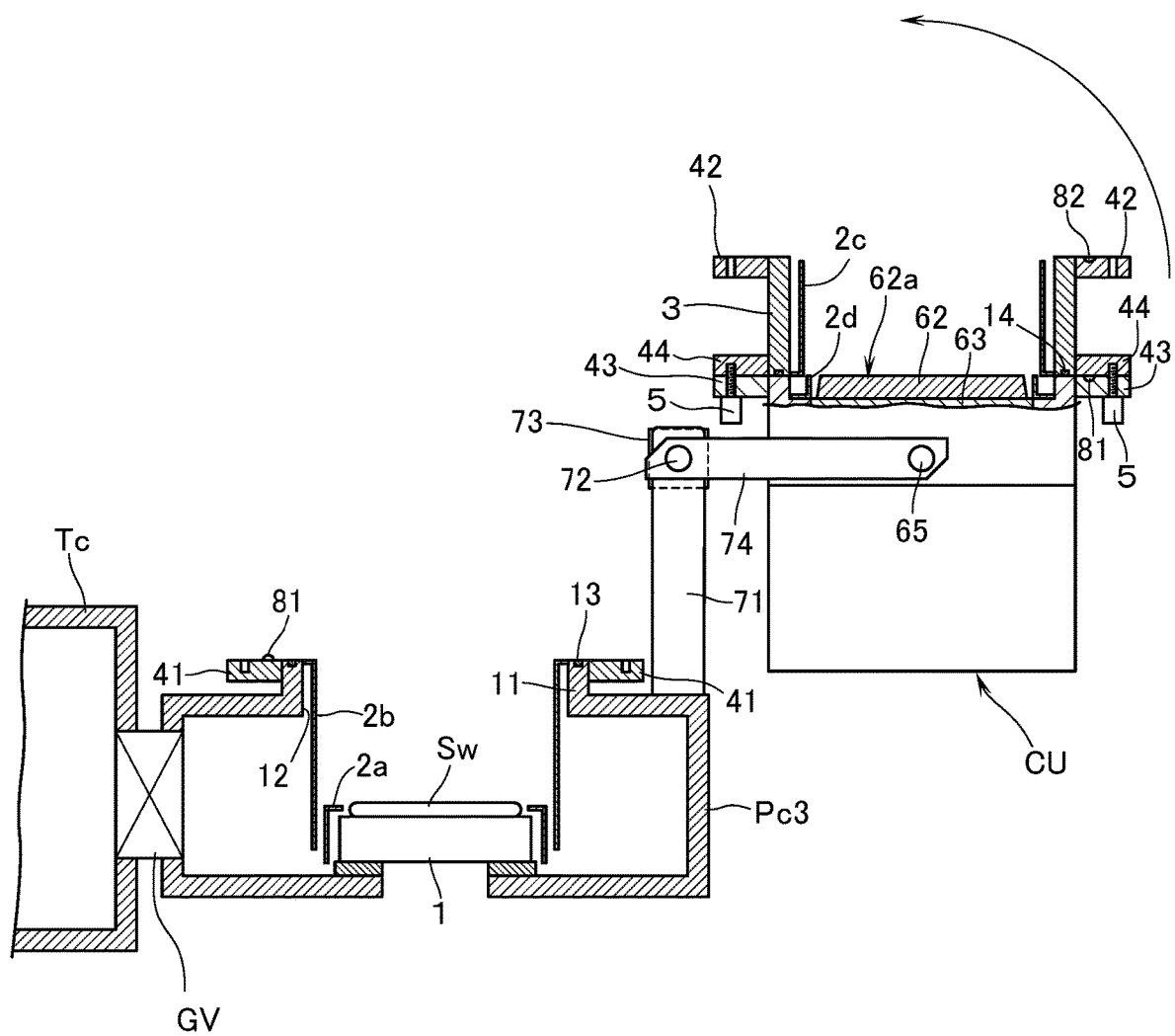
FIG. 5 is a vertical sectional view, corresponding to FIG. 1, in a state in which the communication pipe and the cathode unit have been withdrawn.

On the other hand, in case maintenance is performed on the processing chamber Pc3 after having opened to the atmosphere the processing chamber Pc3 from the state shown in FIG. 2, bolts 5 for fastening each of the fastening blocks 41, 42 are removed by manual operation of the worker, and each of the tightening blocks 43, 44 that lie opposite to each other are tightened with bolts 5, thereby selectively engaging the communication pipe 3 with the cathode unit CU. Then, the rotary shaft 72 is rotated in the normal direction of rotation by the motor 73, and each of the swing arms 74, 74 is swung so as to separate each of the swing arms 74, 74 away from the transport chamber Tc. As a result of this operation, the communication pipe 3, together with the cathode unit CU, is released from the processing chamber Pc3. In the same manner as above, when the swing arms 74, 74 are swung up to the position in which the rotary shaft 72 is rotated 180 degrees rotation, as shown in FIG. 5, the cathode unit CU and the communication pipe 3 are turned upside down at a position radially outward from the transport chamber Tc. According to this operation, the worker can make a direct access to the communication pipe 3 from above, at a position away from the processing chamber Pc3 by a distance depending on the length of the swing arms 74, 74. The worker can replace the deposition preventing plate 2c inside the communication pipe 3. In addition, by making a direct access to the mounting opening 12 of the processing chamber Pc3, the worker can perform the maintenance job such as replacement of the deposition preventing plates 2a, 2b, cleaning of the wall surfaces and the like inside the processing chamber Pc3.

After the completion of the maintenance job, the worker rotates the rotary shaft 72 by the motor 73 in the reverse direction of rotation from the state as shown in FIG. 5, thereby swinging each of the swing arms 74, 74 in the reverse direction. At this time, contrary to the above-mentioned case in which only the cathode unit CU has been mounted, what are swung by each of the swing arms 74, 74 have become longer in length by the length of the communication pipe 3. As a result, when each of the swing arms 74, 74 is swung in the reverse direction of rotation, there is a possibility that the lower end of the communication pipe 3 is not joined, in correct posture, with the upper surface of the projection 11 of the processing chamber Pc3. In this embodiment, provided that the direction in which each of the swing arms 74, 74 is swung from the state shown in FIG. 5 is defined as the front of the swinging direction, at a predetermined upper surface position of two pieces of fastening blocks 41 that are positioned on the front of the swinging direction, there is formed a hemispherical projection 81 at a position on the same imaginary circle. At the same time, on the lower surface of two fastening blocks 42 that lie opposite to the fastening blocks 41, an accepting recess 82 to accept the hemispherical projection is respectively provided (see FIG. 2). According to this arrangement, when each of the swing arms 74, 74 is swung in the reverse direction, the hemispherical projection 81 will be the first to get inserted into the accepting recess 82. In this connection, the hemispherical projection 81 positioned at the front of swinging direction may have formed therein a tilted slope 81a serving as a guide. When each of the swing arms 74, 74 is further swung, while the supporting body 61 is inclining, the projection 81 comes to get fit into the accepting recess 82. As a result, the communication pipe 3 gets joined once again with the upper surface of the projection 11 in a correct posture.

In the above-mentioned embodiment, an arrangement has been made that, by means of the fastening blocks 41-44 and the bolts 5, the processing chamber Pc3 and the communication pipe 3, or the cathode unit CU and the communication pipe 3 are selectively engaged with each other and that, by the swinging of the swing arms 74, 74 what is removed from the processing chamber Pc3 will be changed. The construction has a good maintainability. Further, by fastening each of the fastening blocks 41-44, lying opposite to each other, with bolts 5 by manual operation of the worker, it can advantageously be made to be recognized by the worker as to which particular portions shall be subjected to maintenance job.

A description has so far been made of the embodiment of this invention. As long as the technical idea of this invention is not departed from, various modifications can be made. In the above-mentioned embodiment, a description was made of an example in which the processing unit for performing the vacuum processing was defined as the cathode unit CU for sputtering, and the vacuum apparatus was defined as the sputtering apparatus SM provided with this cathode unit CU, but this invention shall not be limited to the above. The processing unit can be appropriately selected from the known ones depending on the processing to the substrate Sw. Further, in the above-mentioned embodiment, the engaging means was made of an example having each of the fastening blocks 41-44 and bolts 5, and the engagement was selectively made by manual job by the worker, but this invention shall not be limited to the above. An arrangement may be made that, around the fastening portions between the processing chamber Pc3 and the communication pipe 3, and between the cathode unit CU and the communication pipe 3, a claw-shaped hook equipped with an actuator is disposed so that automatic and selective engagement may be made. In addition, description has been made of an example in which each of the swing arms 74, 74 is swung by the motor 73, but this invention shall not be limited to the above, but swinging may alternatively be made manually.

EXPLANATION OF MARKS

| | |
|---|---|
| CU | cathode unit (to-be-processed unit) |
| Pc3 | processing chamber (vacuum chamber) |

-continued

EXPLANATION OF MARKS

| | | | |
|---|---|---|---|
| SM | sputtering apparatus (vacuum processing apparatus) | | |
| Sw | substrate (to-be-processed substrate) | | |
| 3 | communication pipe | | |
| 5 | bolt (engaging means, fastening member) | | |
| 12 | mounting opening | | |
| 41-44 | fastening block (engaging means) | | |
| 72 | rotary shaft | 74 | swing arm |
| 81 | projection | 82 | accepting recess |

The invention claimed is:

1. A vacuum processing apparatus for performing predetermined vacuum processing on a processing surface of a to-be-processed substrate, the vacuum processing apparatus comprising:
   a vacuum chamber having disposed therein the to-be-processed substrate and, provided that a direction in which the to-be-processed surface looks is defined as an upper side, having formed on an upper wall of the vacuum chamber a mounting opening facing the processing surface where a direction in which the processing surface looks is defined as an upper side;
   a processing unit disposed above the vacuum chamber, the process unit for performing therein vacuum processing;
   a communication pipe having a predetermined length and being interposed and connected between an upper wall of the vacuum chamber and a lower surface of a supporting body for the processing unit such that predetermined processing is performed, through the communication pipe, on the to-be-processed substrate inside the vacuum chamber in vacuum atmosphere,
   wherein the processing unit further comprises an engaging means to which is coupled a swing arm to swing about a rotary shaft extending perpendicularly to a vertical direction for selectively engaging the vacuum chamber and the communication pipe or the processing unit and the communication pipe.

2. The vacuum processing apparatus according to claim 1, wherein the engaging mens comprises:
   fastening blocks respectively disposed vertically in a projecting manner on outer surfaces of the processing unit so as to face one another in the vertical direction, and
   fastening members for fastening each of the fastening blocks that lie opposite to one another.

3. The vacuum processing apparatus according to claim 1, further comprising:
   projections, hemispherical in shape disposed in one of the vacuum chamber and the communication pipe at a position on a front side in swinging direction, where the direction in which the processing unit is swung by the swing arm toward the vacuum chamber is defined as the front side in swinging direction; and
   such accepting recesses for receiving the projections as are being formed in the other of the vacuum chamber and the communication pipe.

4. The vacuum processing apparatus according to claim 1, wherein, as a result of said selective engagement, a maintenance job is performed by making a direct access to one of the vacuum chamber and the processing unit.

* * * * *